(12) United States Patent
Han et al.

(10) Patent No.: US 9,673,242 B2
(45) Date of Patent: Jun. 6, 2017

(54) IMAGE SENSOR WITH MICRO LENS INCLUDING A PLURALITY OF LAYERS EACH OF DIFFERENT THICKNESS

(71) Applicants: SK hynix Inc., Gyeonggi-do (KR); POSTECH ACADEMY-INDUSTRY FOUNDATION, Gyeongsangbuk-do (KR)

(72) Inventors: Hae Wook Han, Gyeongsangbuk-do (KR); Young Woong Do, Daegu-si (KR); Won Jun Lee, Incheon-si (KR); Sang Dong Yoo, Seoul (KR); Kyoung In Lee, Gyeonggi-do (KR); Cha Young Lee, Gyeonggi-do (KR)

(73) Assignees: SK Hynix Inc., Gyeonggi-do (KR); Postech Academy-Industry Foundation, Gyeongsangbuk-do (KR)

( * ) Notice: Subject to any disclaimer, the term of this patent is extended or adjusted under 35 U.S.C. 154(b) by 191 days.

(21) Appl. No.: 14/528,687

(22) Filed: Oct. 30, 2014

(65) Prior Publication Data
US 2015/0270303 A1 Sep. 24, 2015

(30) Foreign Application Priority Data
Mar. 19, 2014 (KR) .......................... 10-2014-0031981

(51) Int. Cl.
*H01L 27/146* (2006.01)
*H01L 31/0232* (2014.01)

(52) U.S. Cl.
CPC .. *H01L 27/14627* (2013.01); *H01L 27/14621* (2013.01); *H01L 27/14645* (2013.01); *H01L 31/0232* (2013.01)

(58) Field of Classification Search
CPC ......... H01L 27/14627; H01L 27/14621; H01L 27/14645; H01L 27/14625; H01L 31/0232; H01L 31/02327
USPC ................ 250/208.1, 226, 216, 239, 227.11; 257/257, 258, 431, 432, 433, 434, 435, 257/436, 440, 443; 348/272, 273, 294
See application file for complete search history.

(56) References Cited

U.S. PATENT DOCUMENTS

| | | | | |
|---|---|---|---|---|
| 5,672,519 A * | 9/1997 | Song | ................... | H01L 27/1462 216/26 |
| 5,677,200 A * | 10/1997 | Park | ................... | H01L 27/14621 257/432 |
| 6,661,581 B1 * | 12/2003 | Sankur | ................. | G02B 3/0087 359/619 |
| 6,821,810 B1 * | 11/2004 | Hsiao | ................ | H01L 27/14621 257/432 |
| 7,078,260 B2 * | 7/2006 | Jeon | ................... | H01L 27/14621 257/294 |

(Continued)

FOREIGN PATENT DOCUMENTS

KR 1020120052856 5/2012

*Primary Examiner* — Que T Le
*Assistant Examiner* — Jennifer Bennett
(74) *Attorney, Agent, or Firm* — IP & T Group LLP

(57) ABSTRACT

An image sensor includes a color filter configured to pass a specific color of light; a micro lens formed under the color filter and configured with a plurality of layers in which an upper layer has a smaller area than a lower layer; and a photo device formed under the micro lens and configured to receive light passing through the micro lens and convert the received light into an electrical signal.

13 Claims, 19 Drawing Sheets

(56) References Cited

U.S. PATENT DOCUMENTS

| | | | |
|---|---|---|---|
| 7,317,579 B2* | 1/2008 | Li | G02B 3/0012 |
| | | | 359/652 |
| 8,395,686 B2* | 3/2013 | Tatani | H01L 27/14621 |
| | | | 348/294 |
| 2005/0048690 A1 | 3/2005 | Yamamoto | |
| 2005/0139945 A1* | 6/2005 | Lim | H01L 27/14621 |
| | | | 257/432 |
| 2006/0189062 A1* | 8/2006 | Deng | B29D 11/00278 |
| | | | 438/201 |
| 2006/0278948 A1* | 12/2006 | Yamaguchi | H01L 27/1462 |
| | | | 257/444 |
| 2009/0200623 A1 | 8/2009 | Qian et al. | |

* cited by examiner

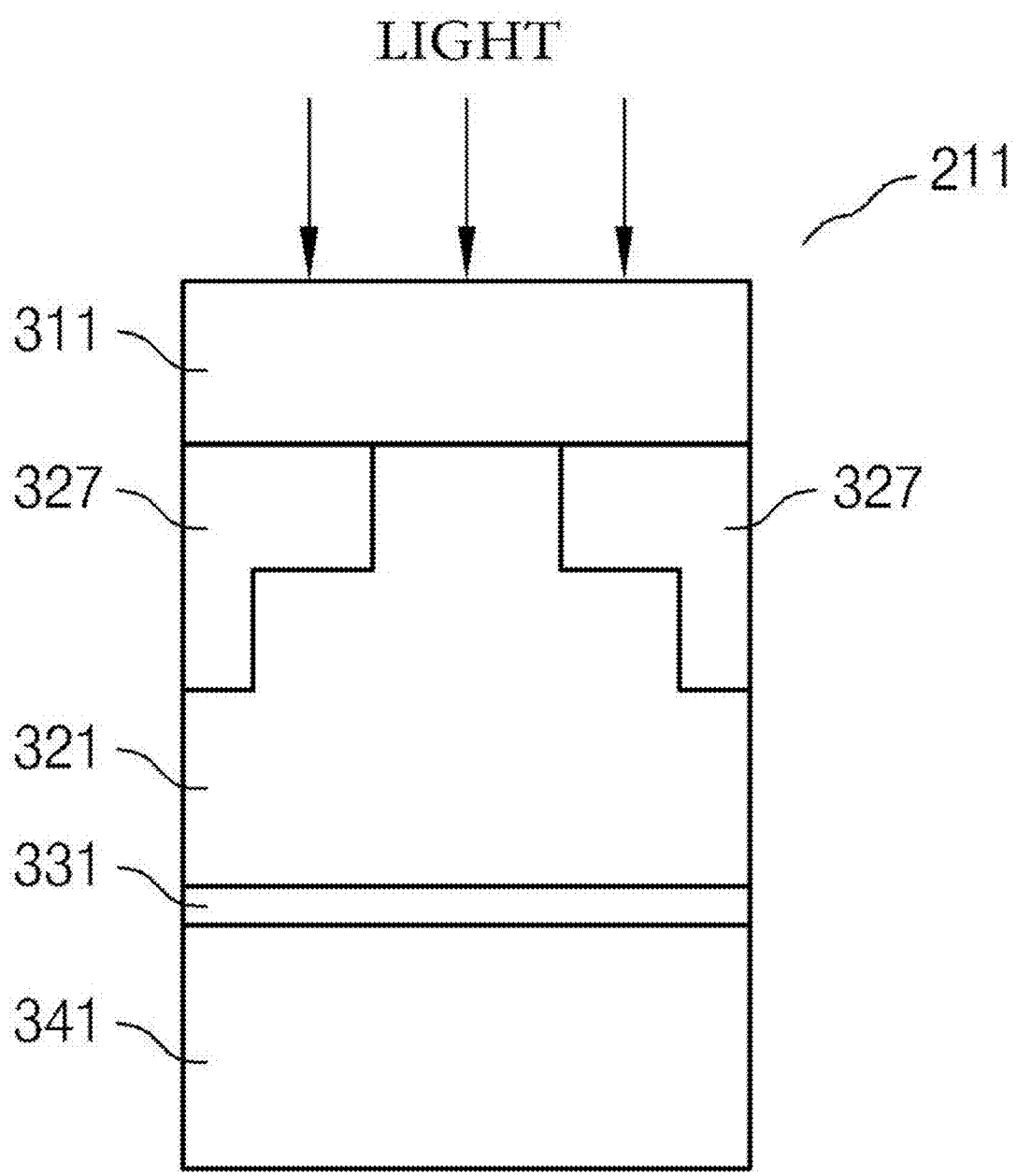

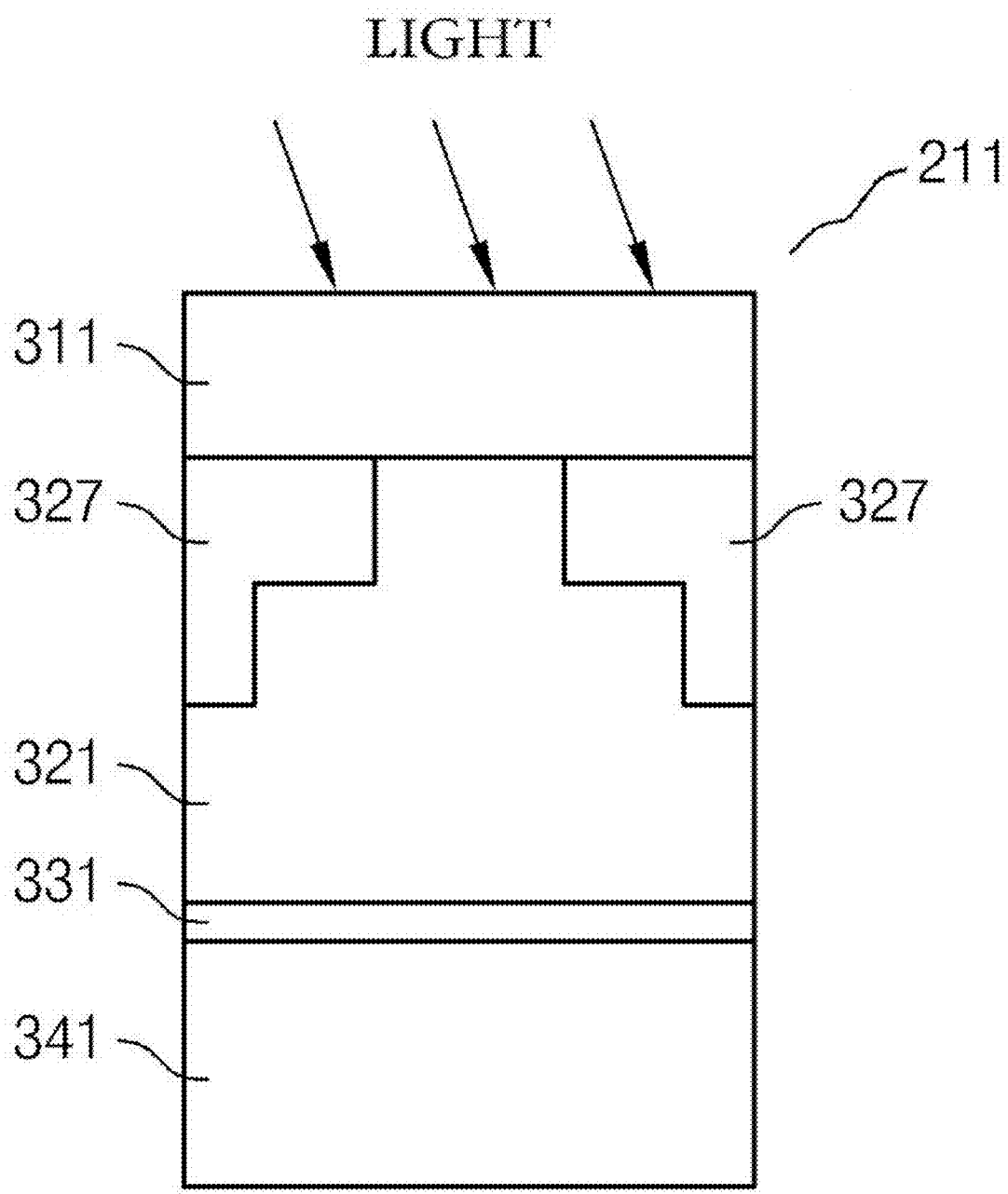

IMAGE SENSOR WITH MICRO LENS INCLUDING A PLURALITY OF LAYERS EACH OF DIFFERENT THICKNESS

CROSS-REFERENCE TO RELATED APPLICATIONS

The present application claims priority of Korean Patent Application No. 10-2014-0031981, filed on Mar. 19, 2014, which is incorporated herein by reference in its entirety.

BACKGROUND OF THE INVENTION

Field of the Invention

Embodiments relate to an image sensor for taking an image, and more particularly, to an image sensor for taking an image using a micro lens.

Description of the Related Art

With development of digital technology, digital devices using the digital technology, snob as digital cameras, mobile phones, game machines, and micro cameras, have rapidly spread. Most of the digital devices include an image sensor that is required for taking an image.

The image sensor serves to sense or take an image. For example, the image sensor converts an image inputted from outside into an electrical signal, arid transmits the electrical signal to a digital processor which processes the image in a digital manner. The image sensor may include a charge coupled device (CCD) image sensor, a complementary metal oxide semiconductor (CMOS) image sensor, and the like.

The CMOS image sensor includes a CMOS transistor. The CMOS transistor is configured with a combination of a P-channel metal oxide semiconductor (MOS) transistor and an N-channel MOS transistor. Since the CMOS transistor has a high integration degree and low power consumption, the CMOS transistor may be configured in one integrated circuit device.

Such an image sensor receives light incident from outside and generates and stores light charges. A color filter may be used to pass only a specific color of light. That is, the color filter may include three color filters such as red, green, and blue color filters or yellow, magenta, and cyan color filters.

However, when light incident on the image sensor from outside has a large incident angle, the reflection factor of the surface of a photo device may be increased to reduce light efficiency. Furthermore, depending on the incident angle, the focal point of light incident on the photo device may be changed to lower definition when an image is reproduced.

SUMMARY OF THE INVENTION

Embodiments are to provide an image sensor capable of improving light condensing efficiency.

According to one aspect of the embodiments, an image sensor includes a color filter configured to pass a specific color of light in light incident from outside; a micro lens formed under the color filter and configured with a plurality of layers in which an upper layer has a smaller area than a lower layer; and a photo diode formed under the micro lens and configured to receive light passing through the micro lens and convert the received light into an electrical signal.

The micro lens may be formed of at least one of silicon nitride (SiN) and oxide. Between the micro lens and an adjacent micro lens, an oxide layer may be formed to isolate the micro lenses.

The micro lens may include: a first layer formed at the uppermost part; a second layer formed under the first layer and having a larger area than the first layer; and a third layer formed under the second layer and having a larger area than the second layer.

The second layer may have a larger thickness than the first layer, and the third layer may have a larger thickness than the second layer. The upper layer may be positioned in the center of the lower layer.

The image sensor may further include an anti-reflection film formed between the micro lens and the photo diode and configured to prevent reflection of light emitted from the micro lens.

The upper and lower layer may be formed in a rectangular shape.

According to another aspect of the embodiments, an image sensor includes a micro lens formed over a photo diode configured to convert incident light into an electrical signal, and configured to condense light incident from outside into one spot and transmit the condensed light to the photo diode. The micro lens includes a circular first layer formed at the uppermost part; a circular second layer formed under the first layer and having a larger area than the first layer; and a rectangular third layer formed under the second layer and having a larger area than the second layer.

The second layer may have a larger thickness than the first layer, and the third layer may have a larger thickness than the second layer.

The first layer may foe positioned in the center of the second layer, and the second layer may be positioned in the center of the third layer.

BRIEF DESCRIPTION OF THE DRAWINGS

The above objects, and other features and advantages of the embodiments will become more apparent from the following detailed description taken in conjunction with the drawings, in which:

FIG. 8A illustrates a state in which external light is incident on the front side of the image sensor;

FIG. 9A illustrates a state in which external light is obliquely incident on the image sensor;

DETAILED DESCRIPTION OF PREFERRED EMBODIMENTS

Figure 1:
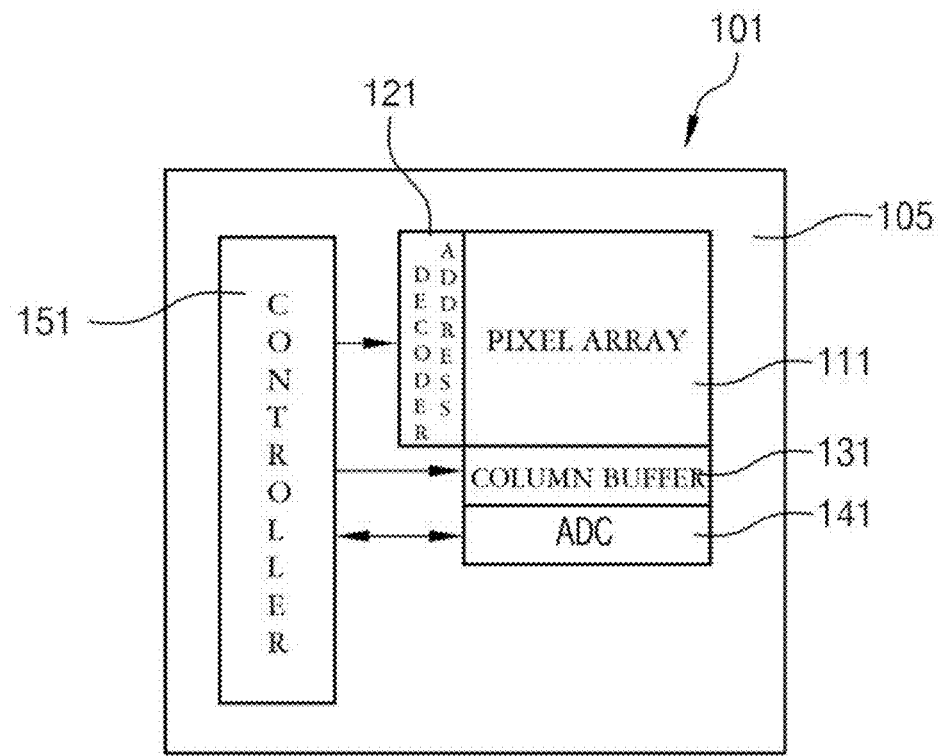
FIG. 1 is a block diagram of a CMOS image sensor according to an embodiment.

Reference will now be made in greater detail to embodiments, examples of which are illustrated in the accompanying drawings. Wherever possible, the same reference numerals will be coed throughout the drawings and the description to refer to the same or like parts.

FIG. 1 is a block diagram of a CMOS image sensor according to an embodiment. Referring to FIG. 1, the CMOS image sensor 101 includes a pixel array 111, an address decoder 121, a column buffer 131, an analog digital converter (ADC) 141, and a controller 151, which are formed over a semiconductor substrate 105.

The pixel array 111 includes a plurality of light sensing devices, that is, a plurality of photo devices. The photo device may be configured with a photo transistor, a photo diode, a photo gate, a pinned photo diode or the like. The plurality of photo devices is arranged in a matrix form. The structure of the pixel array will be described in detail with reference to FIG. 2.

The address decoder 121 decodes an address signal received from the controller 151 and designates a photo device corresponding to the address signal among the plurality of photo devices included in the pixel array 111.

The column buffer 131 buffers a signal outputted in a column-wise manner from the pixel array 111 subject to control by a signal outputted from the controller 151, and outputs the buffered signal.

The ADC 141 receives the signal outputted from the column buffer 131, converts the received signal into a digital signal, and transmits the digital signal to the controller 151.

The controller 151 receives a signal inputted from outside and controls the address decoder 121, the column buffer 131, and the ADC 141. Furthermore, the controller 151 receives a digital signal outputted from the ADC 141, transmits the received digital signal to an external device such as a display to store or display an image.

Figure 2:
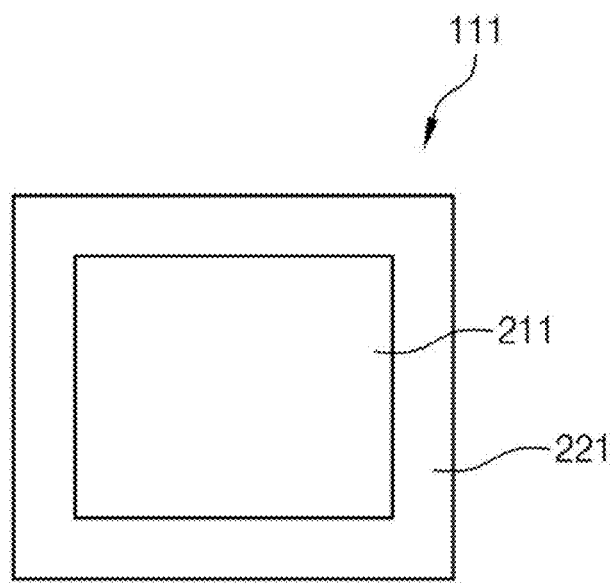
FIG. 2 is a plan view of a pixel array illustrated in FIG. 1.

FIG. 2 is a plan view of the pixel array 111 illustrated in FIG. 1. Referring to FIG. 2, the pixel array 111 is divided into an active pixel region 211 and an optical block region 221.

The active pixel region 211 senses light incident from outside, converts the sensed light into an electrical signal, and outputs the electrical signal to the column buffer 131 of FIG. 1. The active pixel region 211 includes a plurality of main light sensing devices, for example, a plurality of main photo devices arranged in a matrix form.

The optical block region 221 is disposed to surround the active pixel region 211. The optical block region 221 is used to block light from entering from outside and test and evaluate electrical characteristics of the active pixel region 211. For example, the optical block region 221 tests and evaluates the dark noise caused by the dark current, and compensates for current values corresponding to the dark current of the main photo devices in the active pixel region 211 based on an evaluation result, thereby preventing dark noise from occurring in the image sensor.

Figure 3:
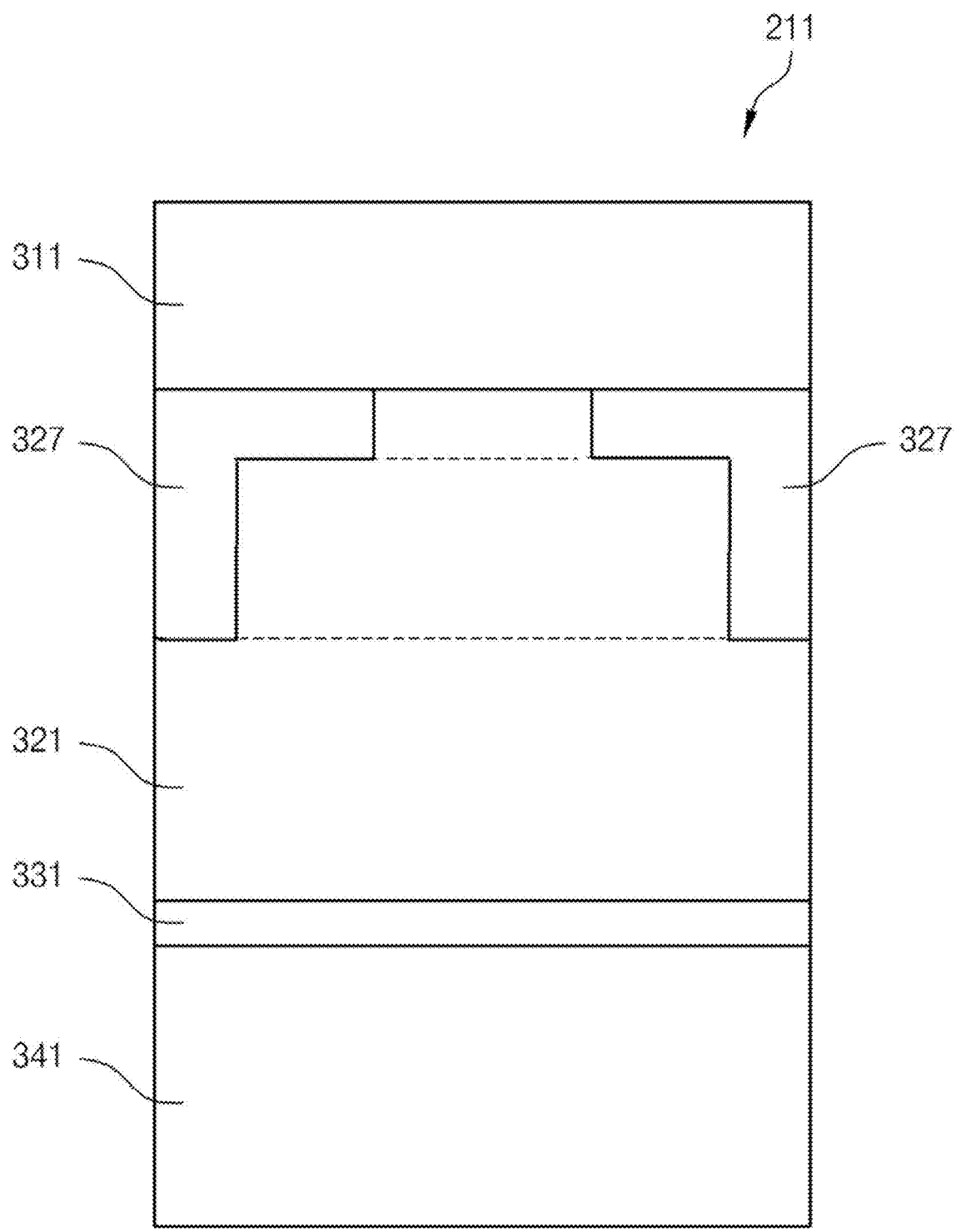
FIG. 3 is a lateral cross-sectional view of a part of the pixel array illustrated in FIG. 2.

FIG. 3 is a lateral cross-sectional view of a part of the pixel array illustrated in FIG. 2. Referring to FIG. 3, the pixel array has a structure in which a color filter 311, a micro lens 321, an anti-reflection film 331, and a photo device 341 are sequentially formed in a direction moving from top to bottom.

The color filter 311 has a filter configured to block ultraviolet light and infrared light from light incident from outside and pass only visible light. The color filter may include a red filter to pass only a red color of visible light, a green filter to pass only a green color of visible light, a blue filter to pass only a blue color of visible light, or a combination thereof. In another embodiment, the color filter 321 may include a cyan filter, a yellow filter, a magenta filter, or a combination thereof.

The micro lens 321 serves to condense a specific color of light passed through the color filter 311. The micro lens 321 may be formed of an insulator 327, for example, silicon nitride (SiN) or silicon oxide ($SiO_2$). The micro lens 321 will be described in detail with reference to FIGS. 4 to 7. Hereinafter, the insulator 327 may be also referred to as an oxide layer 327 for convenience of explanation.

Between the micro lens 321 and an adjacent micro lens (not illustrated), an oxide layer 327 is formed. The oxide layer 327 partially isolates the micro lenses 321 such that the adjacent micro lenses 321 do not interfere with each other.

The anti-reflection film 331 serves to prevent light emitted from the micro lens 321 from reflecting from a surface of the photo device 341. Thus, light which is reflected from the surface of the photo device 341 can be redirected to the photo device 341. The anti-reflection film 331 may be applied onto the surface of the photo device 341 in order to increase light condensing efficiency of the photo device 341 by reducing light reflecting from the surface of the photo device 341 and remove interference or diffusion caused by the reflected light. The anti-reflection film 331 may be formed by coating the surface of the photo device 341 with a dielectric material having a small refractive index using a vacuum deposition method or the like. The anti-reflection film 331 may be formed of oxide or silicon nitride, and has a thickness of 60 nm, for example.

The photo device 341 receives light passing through or reflected by the anti-reflection film 331, converts the received light into an electrical signal, and outputs the electrical signal to the controller 151 of FIG. 1 or to an external device. Since the function of the photo device 341 to convert light into an electrical signal is a well-known technique, detailed descriptions thereof are omitted.

Figure 4:
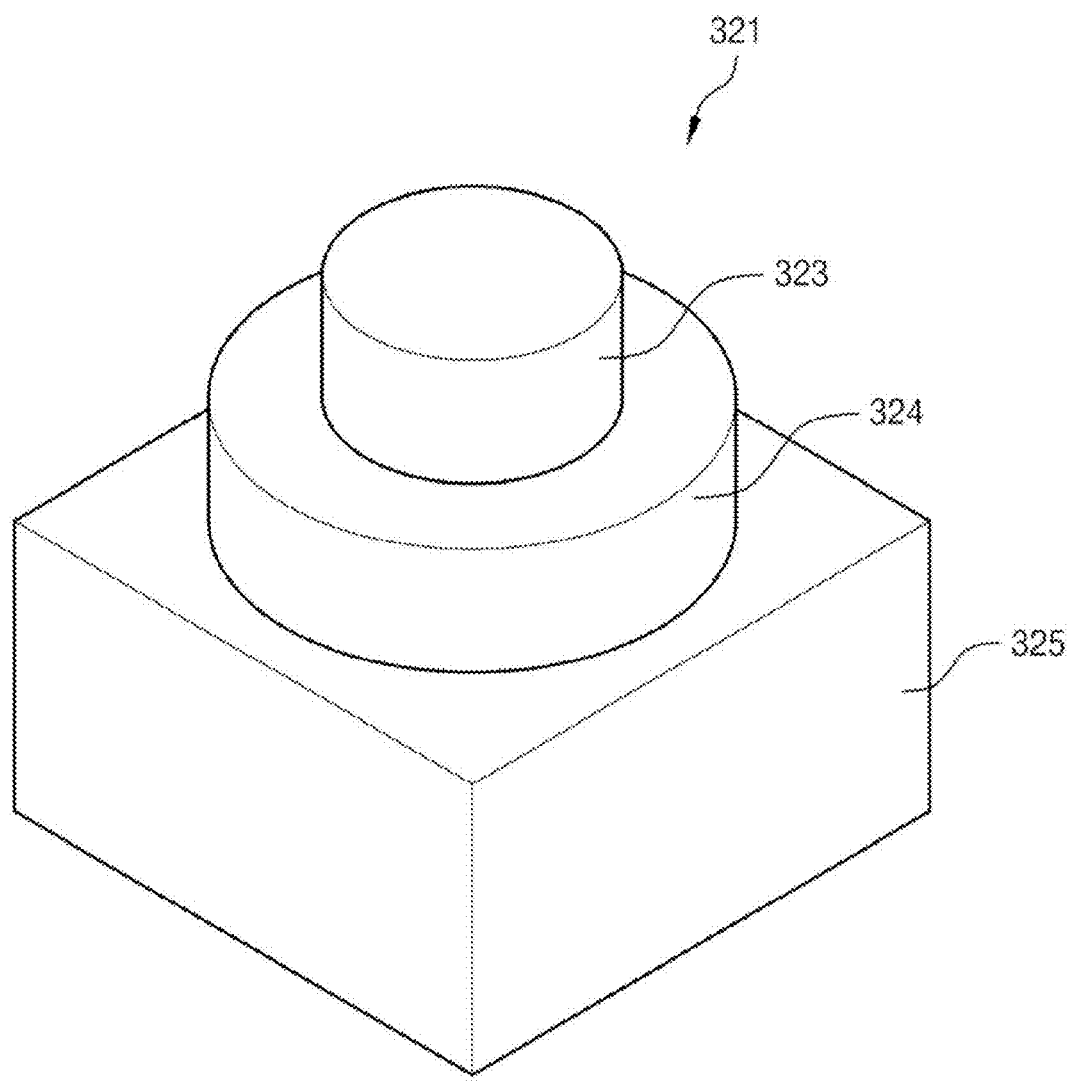
FIG. 4 is a plan view of a first embodiment of a micro lens illustrated in FIG. 3.
Figure 5:
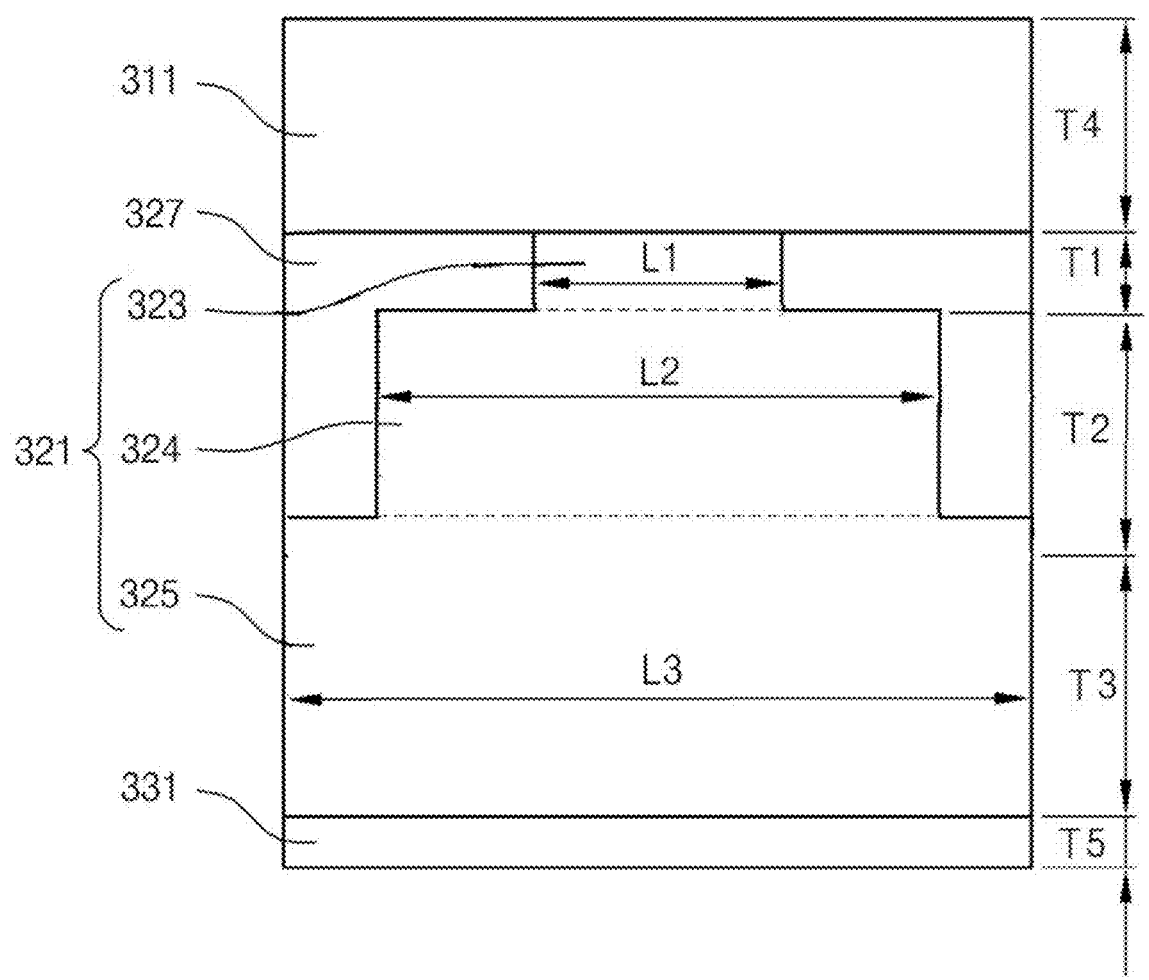
FIG. 5 is a lateral cross-sectional view for explaining sizes of a color filter, the micro lens, and an anti-reflection film which are illustrated in FIG. 3.

FIG. 4 is a plan view of the micro lens 321 illustrated in FIG. 3. FIG. 5 is a lateral cross-sectional view for explaining sizes of the color filter 311, the micro lens 321, and the anti-reflection film 331 which are illustrated in FIG. 3.

Referring to FIGS. 4 and 5, the micro lens 321 has a multi-step structure. For example, the micro lens 321 includes a plurality of layers, for example, first to third layers 323 to 325.

The first layer 323 is formed in a circular shape and has the smallest area among the three layers 323 to 325.

The second layer 324 is formed in a circular shape and has a larger area than the first layer 323 and a smaller area than the third layer 325.

The third layer 325, which is serving as, for example, a guiding layer, is formed in a rectangular shape and has the largest area among the three layers 323 to 325.

The second layer 324 may be formed to have a larger thickness T2 than the thickness T1 of the first layer 323, and the third layer 325 may be formed to have a larger thickness T3 than the thickness T2 of the second layer 324. As such, when the second layer 324 has a larger thickness than the first layer 323, optical characteristics of the micro lens may be improved.

The thicknesses of the first and second layers 323 and 324 are inversely proportional to the thickness of the third layer 325. That is, when the first and second layers 323 and 324 have a large thickness, the third layer 325 needs to have a small thickness, and when the first and second layers 323 and 324 have a small thickness, the third layer 325 needs to have a large thickness. That is because when the first and second layers 323 and 324 have large thicknesses, the focal length of light incident from outside decreases, and when the first and second layers 323 and 324 have small thicknesses, the focal length of the light incident from outside increases.

Figure 14A:
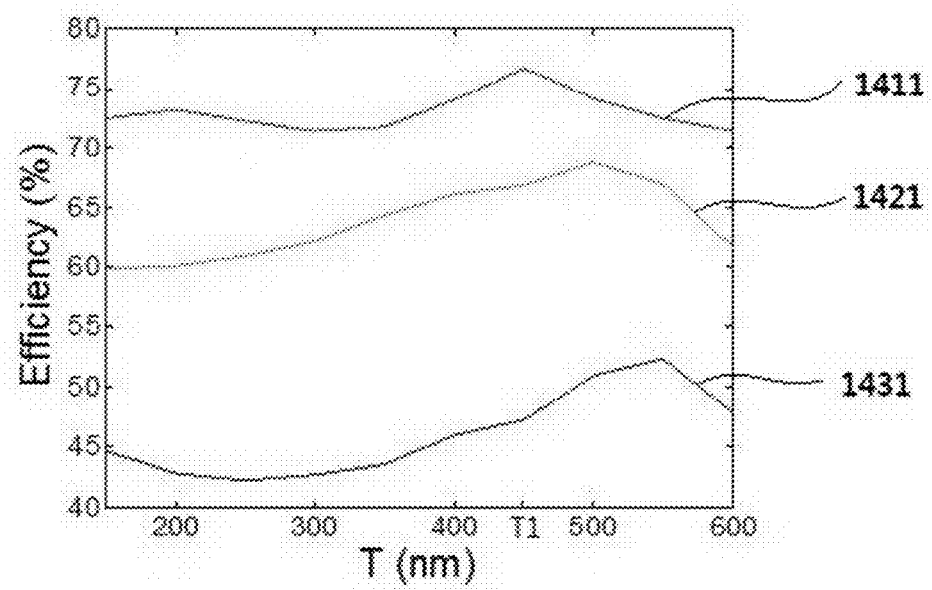
FIGS. 14A and 14B illustrate changes in optical characteristic depending on thicknesses of second layer illustrated in FIGS. 4 and 5.
Figure 14B:
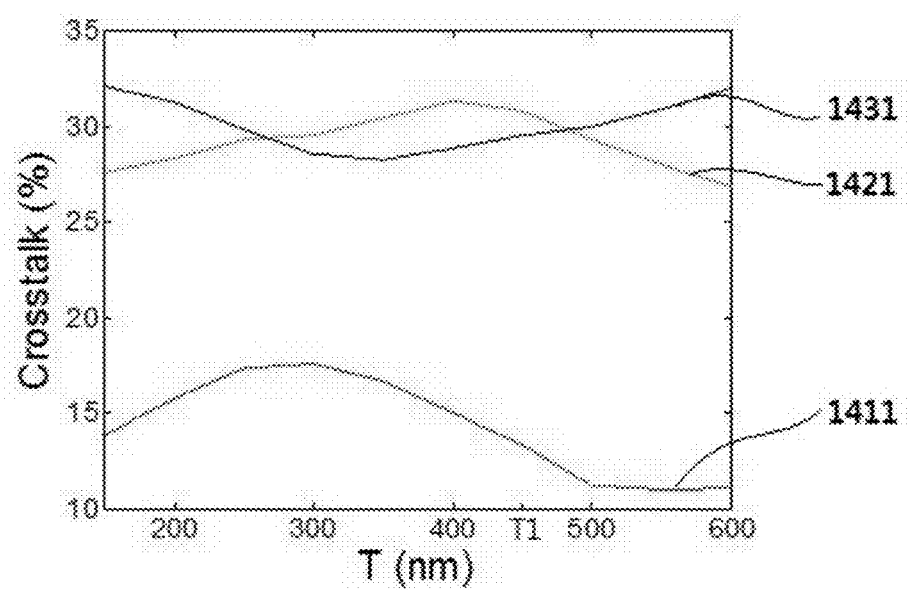

FIGS. 14A and 14B illustrate changes in optical characteristics depending on thicknesses of the second layer 324. That is, FIG. 14A illustrates light transmission efficiency (vertical axis) of red light 1411, green light 1421, and blue light 1431 when the thickness of the second layer 324 is 450 nm (T1 of horizontal axis). FIG. 14B illustrates crosstalk (vertical axis) of the red light 1411, the green light 1421, and the blue light 1431 when the thickness of the second layer 324 is 450 nm (T1 of horizontal axis).

FIGS. 14A and 14B indicate that when the first layer 323 has a larger thickness than the second layer 324, for example, when the thickness of the second layer 324 is 450 nm, optical characteristics (light transmission efficiency and crosstalk of red light, green light, and blue light) of the micro lens according to an embodiment may be significantly improved.

The length or a width L2 of the second layer 324 is larger than the length or width L1 of the first layer 323, and the length or width L3 of the third layer 325 is larger than the length or width L2 of the second layer 324.

The color filter 311 has the same length as the third layer 325.

The first layer 323 may extend in parallel to the second, layer 324.

The first to third layers 323 to 325 may include silicon nitride (SiN) or silicon oxide (SiO). For example, the first and second layers 323 and 324 may include SiN, and the third layer 325 may include oxide. When the third layer 325 is formed of SiN, light absorption may be reduced by 2.2% red colored light, by 1.4% for green colored light, or by 4.0% for blue colored light, compared to when the third layer 325 is formed of oxide. Also, light transmission may be reduced by −1.8% for red colored light, by −1.5% for green color of light, or by 3.8% for blue colored light, compared to when the third layer 325 is formed of oxide.

The anti-reflection layer 331 may be formed to have a smaller thickness T5 than the thickness T1 of the first layer 323 or the thickness T2 of the second layer 324.

The first layer 323 is formed substantially in the center of the second layer 324, the second layer 324 is formed substantially in the center of the third layer 325. The third layer 325 is formed substantially over the entire surface of the photo device 341 of FIG. 3.

The numerical values for the micro lens 211 according to an embodiment are not limitative.

In another embodiment, the numerical values such as the thickness and length presented above may be modified depending on the environment, design, and applications. Furthermore, the material used in the micro lens may also be replaced with another material depending on applications.

Figure 6:
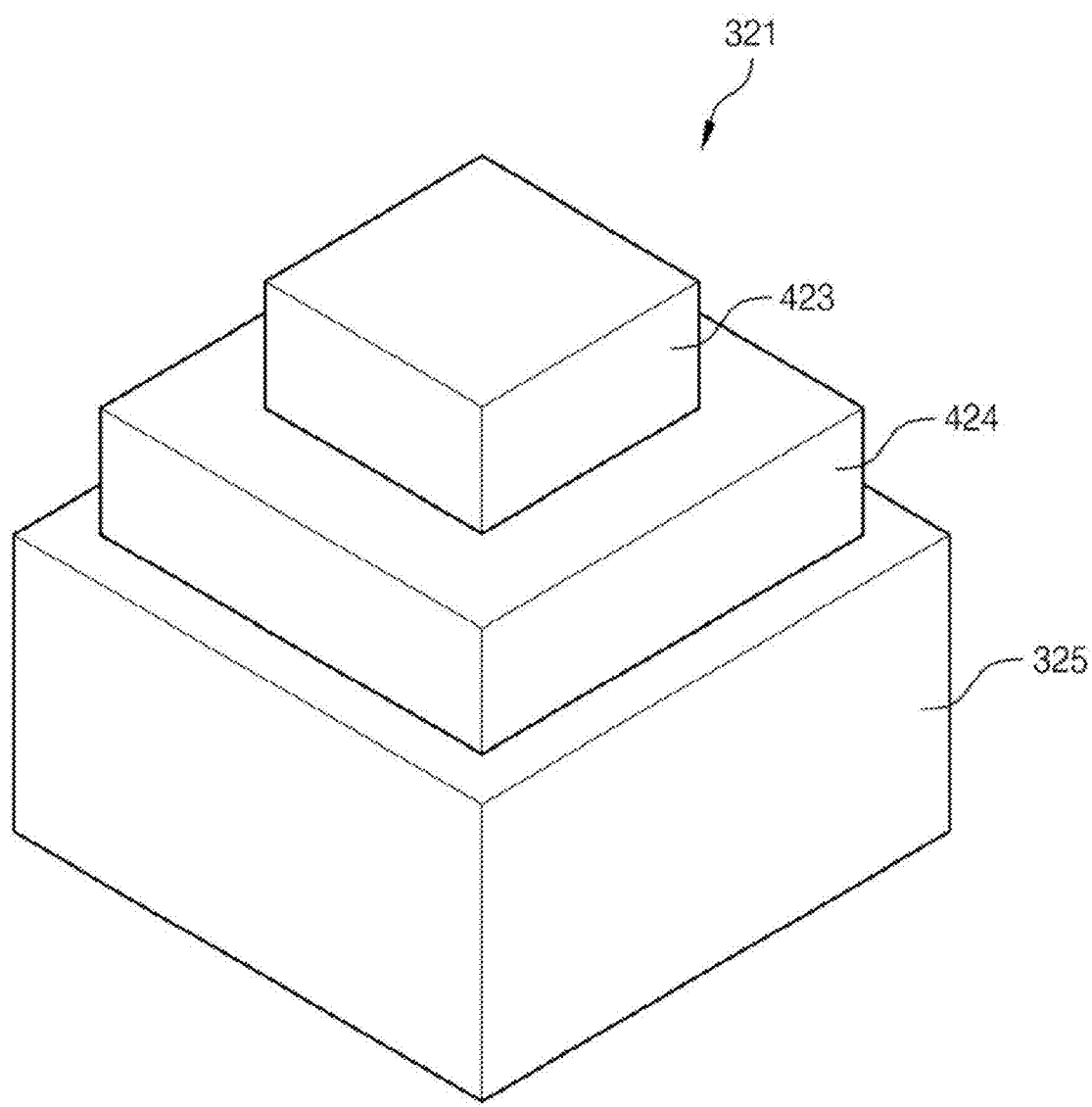
FIG. 6 is a perspective view of a second embodiment of the micro lens illustrated in FIG. 3.

FIG. 6 is a perspective view of a second embodiment of the micro lens 321 illustrated in FIG. 3. Referring to FIG. 6, the micro lens 321 has a multi-step structure including first to third layers 423, 424, and 325, for example.

The first layer 423 is formed in a rectangular shape and has the smallest area among the three layers 423, 424, and 325.

The second layer 424 is formed in a rectangular shape and has a larger area than the first layer 423 and a smaller area than the third layer 325.

The third layer 325 is formed in a rectangular shape and has the largest area among the three layers 423, 424, and 325.

The first to third layers 423, 424, and 325 may be formed to have the same thicknesses as those illustrated in FIG. 5.

The first layer 423 is formed substantially in the center of the second layer 424, the second layer 424 is formed substantially in a center of the third layer 325, and the third layer 325 is formed substantially over the entire surface of the photo device 341 of FIG. 3.

The first layer 423 may disposed in parallel to the second layer 424.

Figure 7:
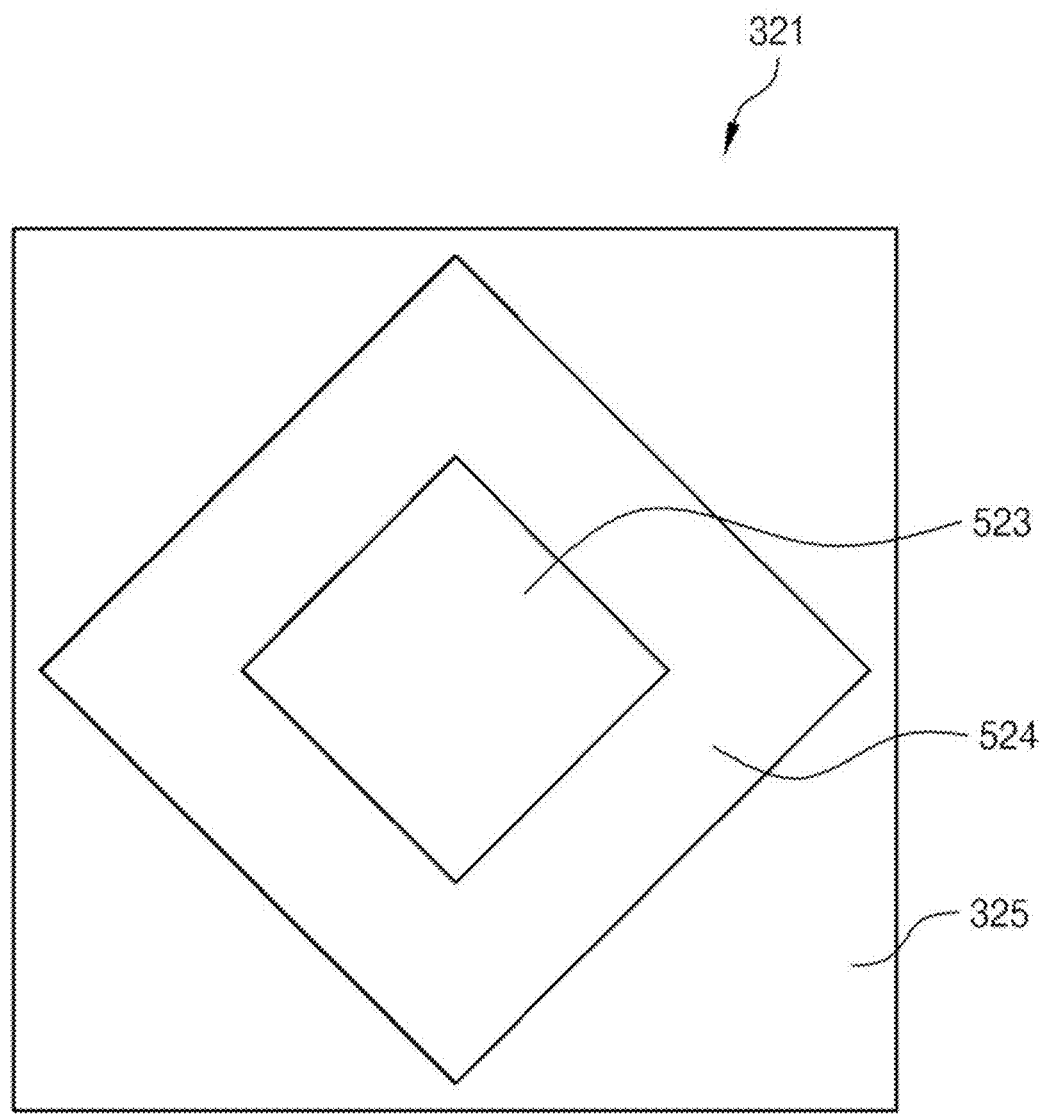
FIG. 7 is a plan view of a third embodiment of the micro lens illustrated in FIG. 3.

FIG. 7 is a plan view of a third embodiment of the micro lens 321 illustrated in FIG. 3. Referring to FIG. 7, the micro lens 321 has a multi-step structure including first to third layers 523, 524, and 325, for example.

The first layer 523 is formed in a diamond shape and has the smallest area among the three layers 523, 524, and 325.

The second layer 524 is formed in a diamond shape and has a larger area than the first layer 523 and a smaller area than the third layer 325.

The third layer 325 is formed in a rectangular shape and has the largest area among the three layers 523, 524, and 325.

The first to third layers 523, 524, and 325 may be formed to have the same thicknesses as those illustrated in FIG. 5.

The first layer 523 is formed in the center of the second layer 524, the second layer 524 is formed in the center of the third layer 325, and the third layer 325 is formed over the entire surface of the photo device 341 of FIG. 3.

The first layer 523 may be in parallel to the second layer 524, respectively.

In another embodiment, the first and second layers of the micro lens 321 may be formed in various shapes such as triangle and hexagon.

FIGS. 4 to 7 illustrate that the .micro lens 321 includes only three layers, that is, the first to third layers. However, the micro lens 321 may include two layers or four or more layers. The thicknesses of the respective layers may he properly set depending on the structure of the micro lens 321.

Figure 8B:
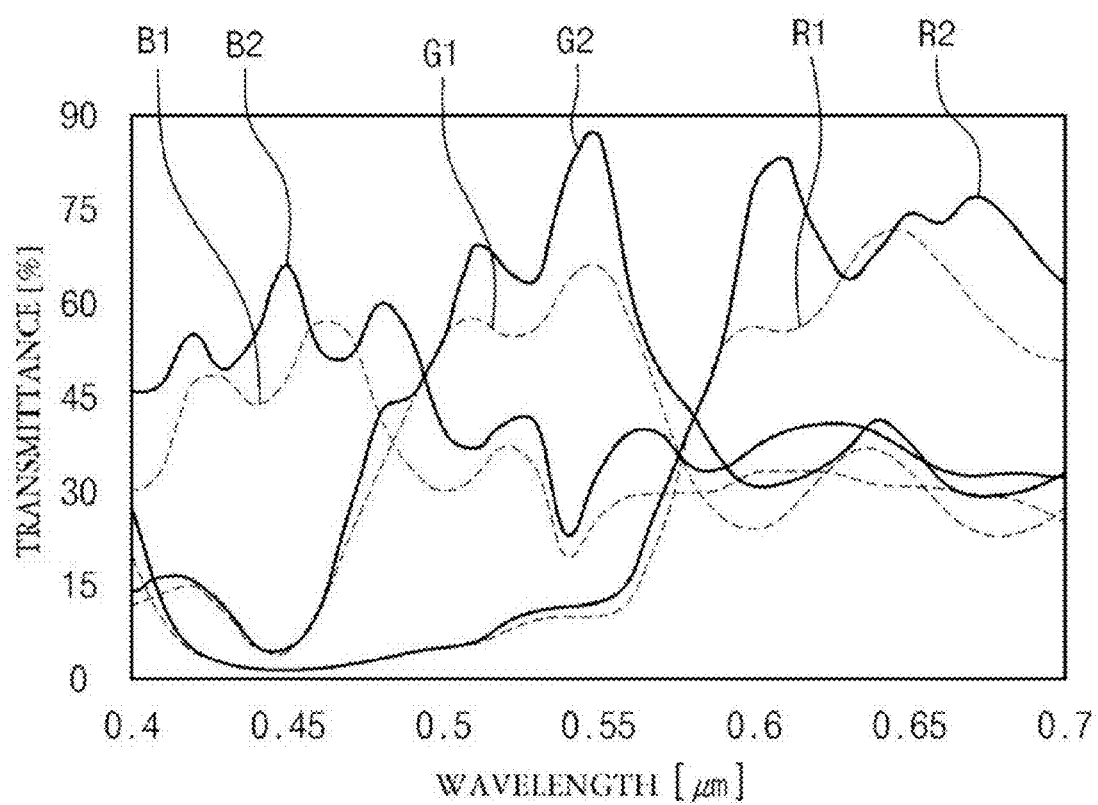
FIG. 8B is a graph comparatively illustrating optical characteristics of an image sensor in related art and optical characteristics of an image sensor according to an embodiment, when external light is incident on front sides of the image sensors.

FIG. 8A illustrates a state in which external light is incident on a front side of the image sensor 211 at a right angle. FIG. 8B is a graph comparatively illustrating optical characteristics of an image sensor in related art and optical characteristics of the image sensor 211 of FIG. 3 according to an embodiment, when external light is incident on front sides of the image sensors. That is, FIG. 8B illustrates transmittances of blue light, green light, and red light which are generated when external light is incident on the front side of the color filter 211. In FIG. 8B, solid lines indicate the transmittances of the image sensor 211 of FIG. 3 according to an embodiment, and dotted lines indicate the transmittances of the image sensor of the related art.

FIG. 8B indicates that the transmittance B2 of blue light, the transmittance G2 of green light, and the transmittance R2 of red light in the image sensor 211 according to an embodiment are higher than the transmittance B1 of blue light, the transmittance G1 of green light, and the transmittance R1 of red light in the linage sensor of the related art.

As such, when external light is incident on the front side of the image sensor 211, the transmittances of blue light, green light, and red light in the image sensor 211 according to an embodiment are higher than those in the image sensor of the related art.

Figure 9B:
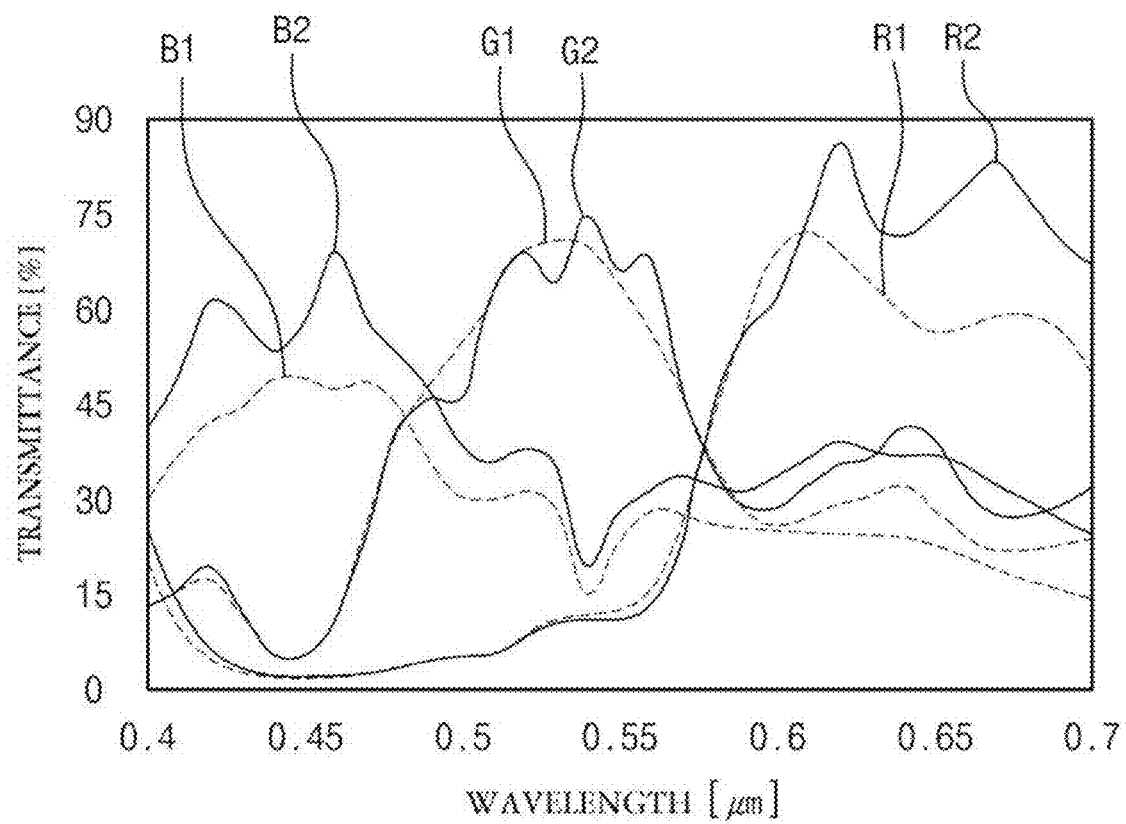
FIG. 9B is a graph comparatively illustrating optical characteristics of an image sensor in related art and optical characteristics of an image sensor according to an embodiment, when external light is obliquely incident.

FIG. 9A illustrates a state in which external light is obliquely incident on the image sensor 211. FIG. 9B is a graph comparatively illustrating optical characteristics of an image sensor in related art and optical characteristics of the image sensor 211 according to an embodiment when external light is obliquely incident. That is, FIG. 9B illustrates the transmittances of blue light, green light, and red light which are generated when external light is obliquely incident on the image sensor 211. In FIG. 9B, solid lines indicate the transmittances of the image sensor 211 according to an embodiment, and dotted lines indicate the transmittances of the image sensor of the related art.

FIG. 9B indicates that the transmittance B2 of blue light, the transmittance G2 of green light, and the transmittance R2 of red light in the image sensor 211 according to an embodiment are higher than the transmittance B1 of blue light, the transmittance G1 of green light, and the transmittance R1 of red light in the linage sensor of the related art.

As such, even when external light is obliquely incident on the image sensor 211, that is, even when external light is incident at a specific incident angle, the transmittances of blue light, green light, and red light in the image sensor 211 according to an embodiment are higher than those in the image sensor of the related art.

Figure 10A:
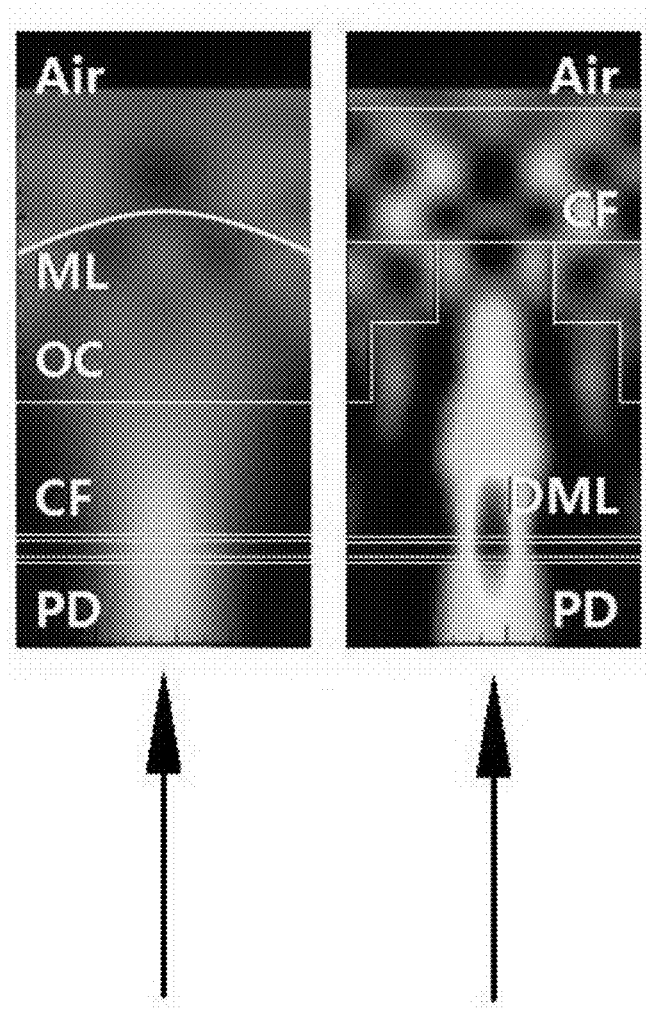
FIGS. 10A to 10C are images for comparing transmission characteristics of an image sensor in related art and an image sensor according to an embodiment, when external light is incident on front sides of the image sensors.
Figure 10B:
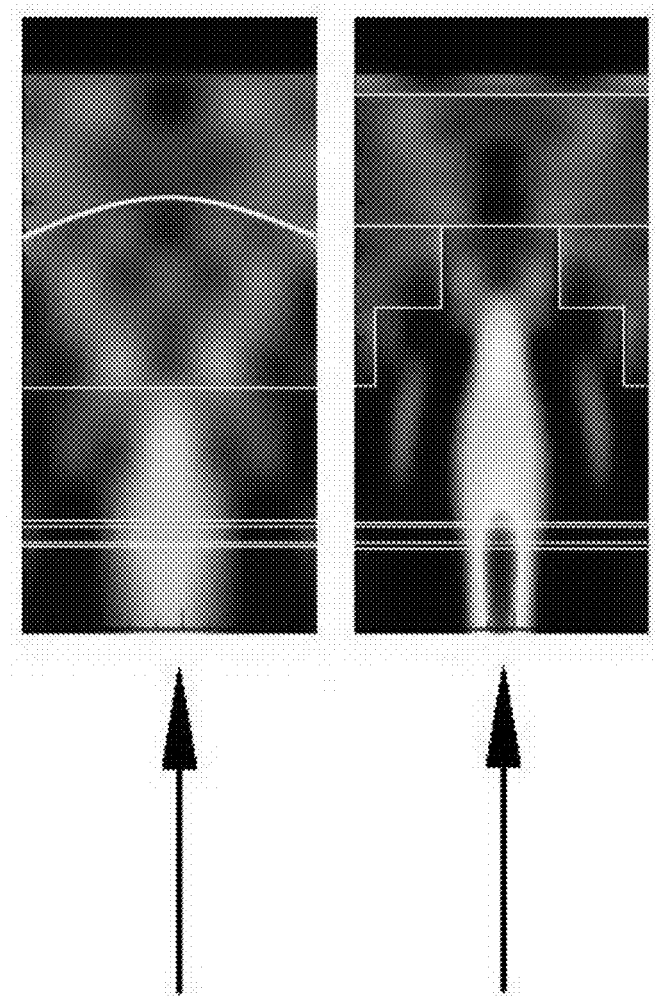
Figure 10C:
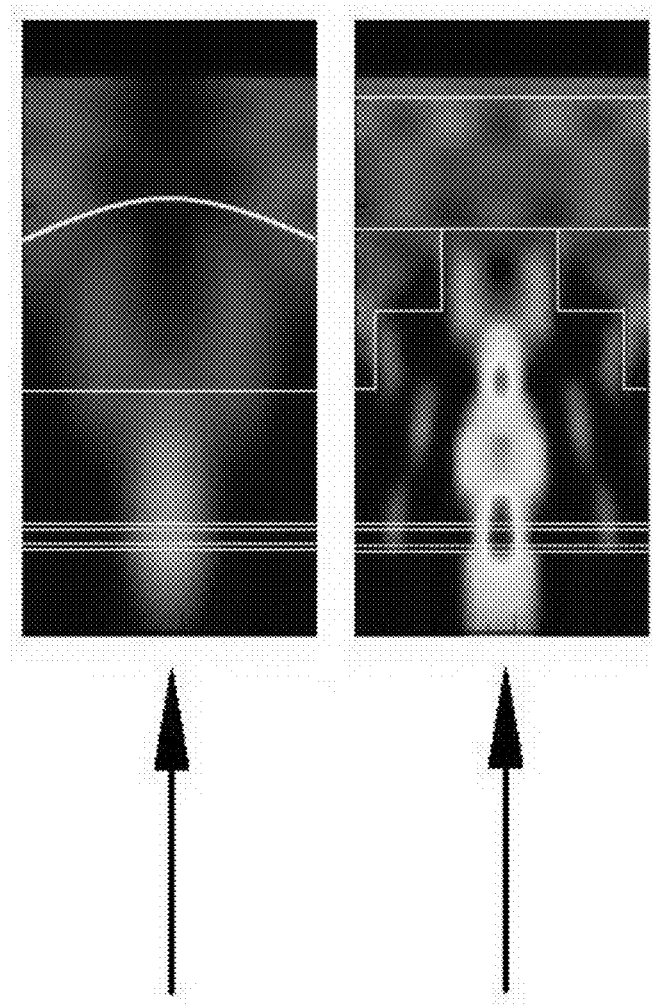

FIGS. 10A to 10C are images for comparing the transmission characteristics of the image sensor of the related art and the image sensor 211 according to an embodiment, when external light is incident on the front sides of the image sensors at a right angle. Specifically, FIG. 10A illustrates the transmission characteristics of red light, FIG. 10B illustrates the transmission characteristics of green light, and FIG. 10C illustrates the transmission characteristics of blue light. Furthermore, left images of FIGS. 10A to 10C illustrate transmission characteristics of an image sensor in related art, the right images of FIGS. 10A to 10C illustrate transmission characteristics of the image sensor 211 according to an embodiment.

Referring to FIG. 10A to 10C, the light (red light, green light, or blue light) incident from outside is not accurately concentrated on one spot of the surface of the photo device in the linage sensor in related art, as indicated by an arrow. However, in the image sensor 211 according to an embodiment, the light (red light, green light, or blue light) incident from outside is accurately concentrated on one spot of the surface of the photo device, as indicated by an arrow.

As such, the transmission characteristics of the image sensor 211 according to an embodiment are more favorable than the transmission characteristics of the image sensor of the related art.

Figure 11A:
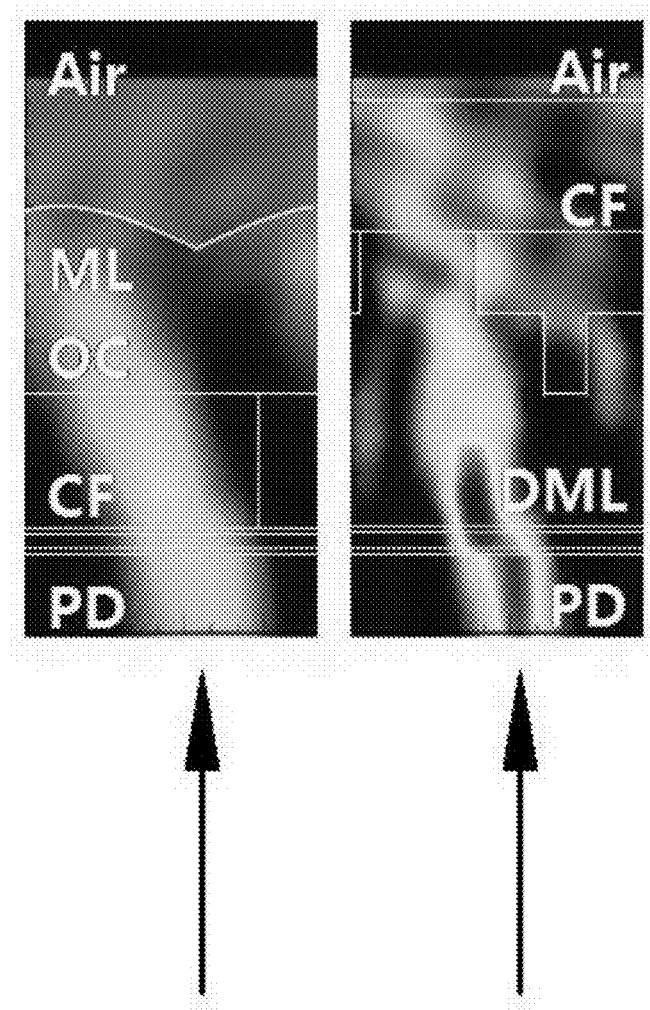
FIGS. 11A to 11C are images for comparing transmission characteristics of an image sensor in related art and an image sensor according to an embodiment, when external light is obliquely incident.
Figure 11B:
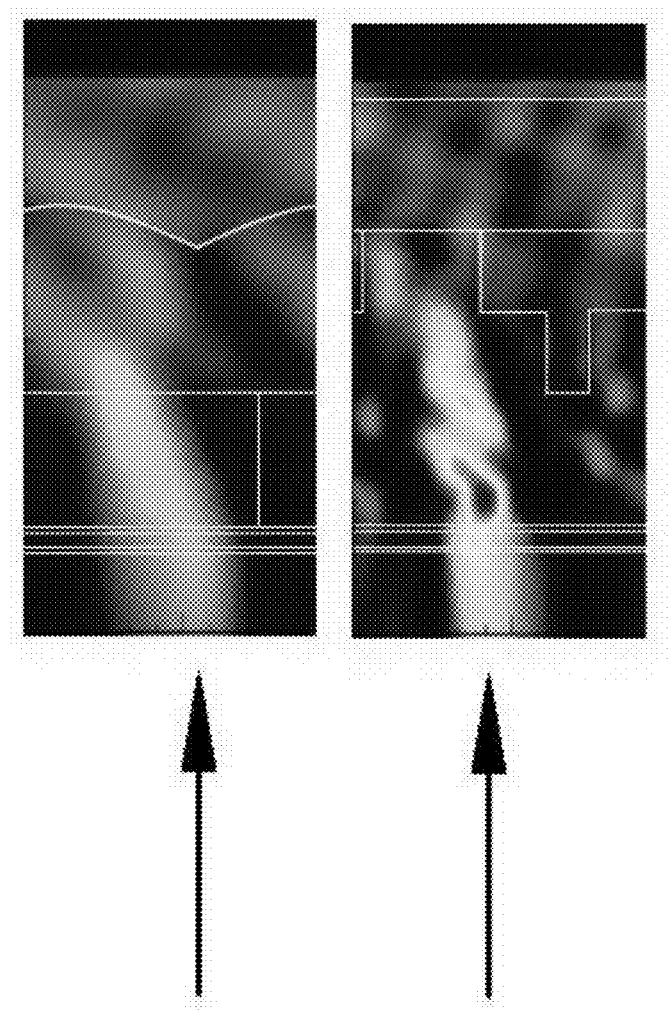
Figure 11C:
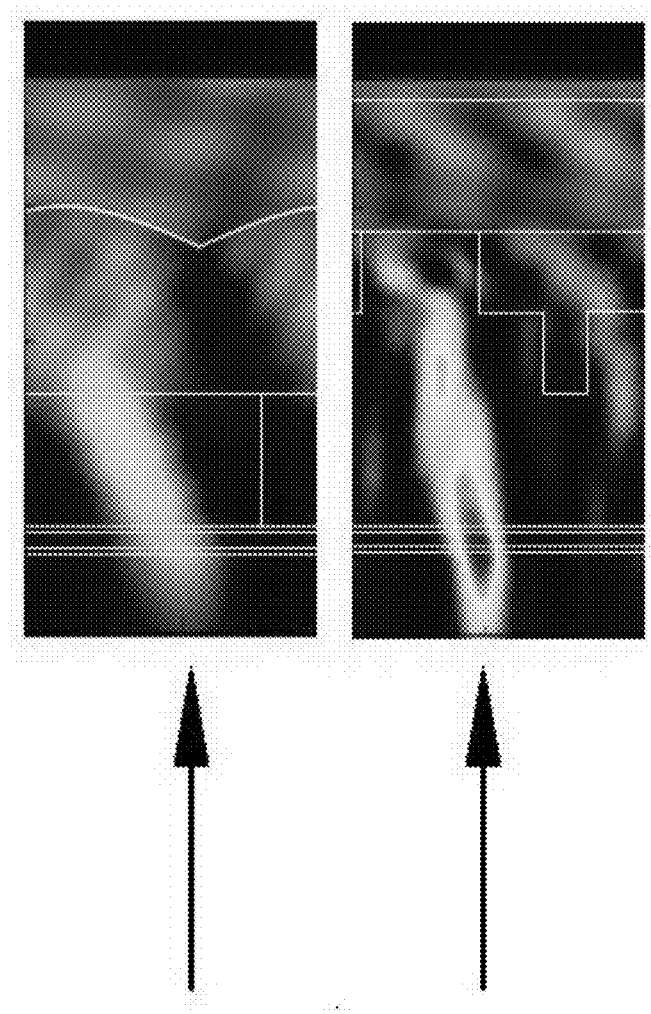

FIGS. 11A to 11C are images for comparing transmission characteristics of the image sensor in related art and the image sensor 211 according to an embodiment when external light is obliquely incident. Specifically, FIG. 11A illustrates transmission characteristics of red light, FIG. 11B illustrates transmission characteristics of green light, and FIG. 11C illustrates transmission characteristics of blue light. Furthermore, left images of FIGS. 11A to 11C illustrate transmission characteristics of the image sensor of the related art, and right images of FIGS. 11A to 11C illustrate transmission characteristics of the image sensor 211 according to an embodiment.

Referring to FIGS. 11A to 11C, light (red light, green light, or blue light) incident from outside is not accurately concentrated on one spot of the surface of the photo device in the image sensor of the related art, as indicated by an arrow. However, in the image sensor 211 according to an embodiment, the intensity of light (red light, green light, or blue light) is concentrated on one spot of the surface of the photo diode, as indicated by an arrow.

As such, even when external light enters obliquely, the transmission characteristics of the image sensor 211 according to an embodiment are more favorable than the transmission characteristics of the image sensor of the related art.

Figure 12A:
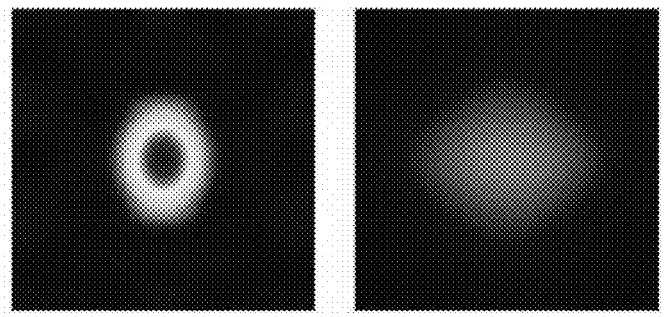
FIGS. 12A to 12C are images illustrating light intensity of an image sensor in related art and an image sensor according to an embodiment, when external light is incident on front sides of the image sensors.
Figure 12B:
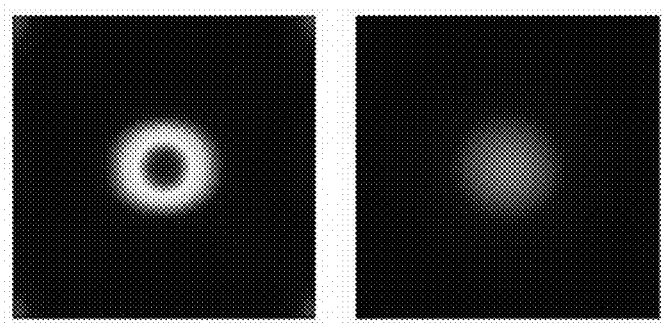
Figure 12C:
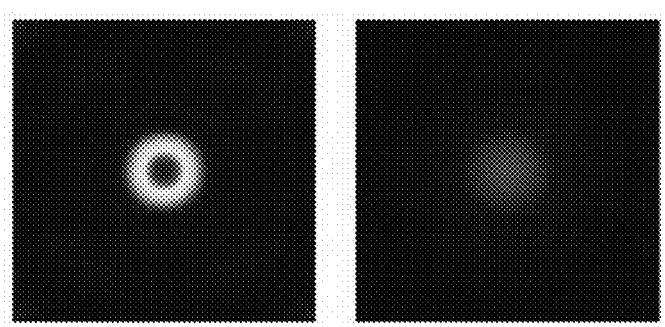

FIGS. 12A to 12C are images illustrating light intensity of an image sensor in related art and the image sensor 211 according to an embodiment when external light is incident on front sides of the image sensors at a right angle. FIGS. 12A to 12C illustrate the surfaces of the image sensors, through which light is passed. Specifically, FIG. 12A illustrates the intensity of red light, FIG. 12B illustrates the intensity of green light, and FIG. 12C illustrates the intensity of blue light. Furthermore, right images of FIGS. 12A to 12C illustrate the intensity of an image sensor of the related art, and left images of FIGS. 12A to 12C illustrate intensity of the image sensor 211 according to an embodiment.

Referring to FIGS. 12A to 12C, in the image sensor of the related art, the light (red light, green light, or blue light) incident from outside is not accurately concentrated on one spot of the surface of the photo device but widely distributed as indicated by an arrow. However, in the image sensor 211 according to an embodiment, the light (red light, green light, or blue light) incident from outside is accurately concentrated on one spot of the surface of the photo device.

As such, the light concentration characteristics of the image sensor 211 according to an embodiment are more favorable than that of the image sensor of the related art. That is, the image sensor 211 according to an embodiment has much higher light condensing efficiency than the image sensor of the related art.

Figure 13A:
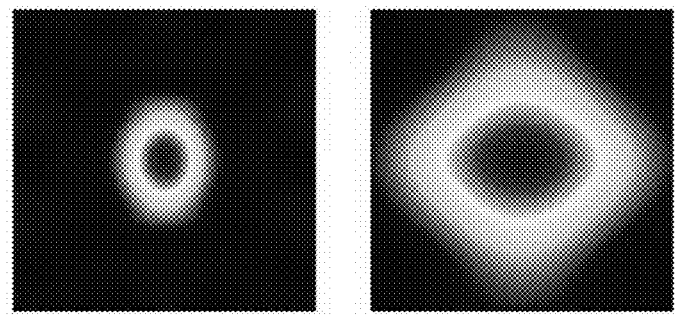
FIGS. 13A to 13C are images illustrating normalized light intensity of an image sensor in related art and an image sensor according to an embodiment, when external light is incident on front sides of the image sensors.
Figure 13B:
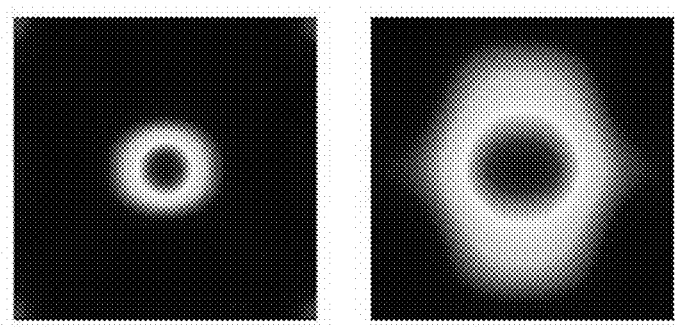
Figure 13C:
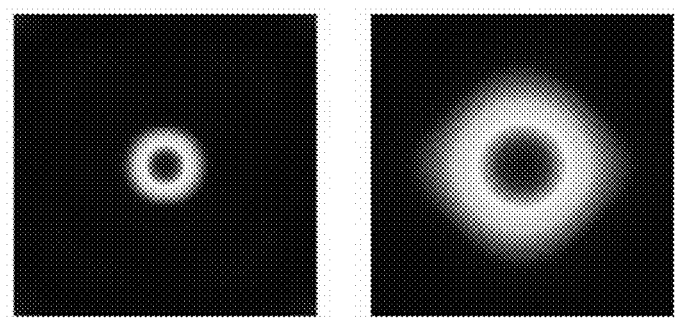

FIGS. 13A to 13C are images illustrating normalized light concentration of the image sensor of the related art and the image sensor 211 according to an embodiment when external light is incident on the front sides of the image sensors at a right angle. FIGS. 13A to 13C illustrate surfaces of the image sensors, through which light is passed. Specifically, FIG. 13A illustrates transmission characteristics of red light, FIG. 13B illustrates transmission characteristics of green light, and FIG. 13C illustrates transmission characteristics of blue light. Furthermore, right images of FIGS. 13A to 13C illustrate transmission characteristics of the image sensor of the related art, and left images of FIGS. 13A to 13C illustrate transmission characteristics of the image sensor 211 according to an embodiment.

Referring to FIGS. 13A to 13C, in the image sensor of the related art, light (red light, green light, or blue light) incident from outside is not concentrated on one spot of the surface of the photo device but widely distributed as indicated by an arrow. However, in the image sensor 211 according to an embodiment, the light (red light, green light, or blue light) incident from outside is accurately concentrated on one spot of the surface of the photo device.

As such, light concentration of the image sensor 211 according to an embodiment is more favorable than that of the image sensor of the related art. That is, the image sensor 211 according to an embodiment has much higher light condensing efficiency than the image sensor of the related art.

According to embodiments, the micro lens provided in the image sensor may be formed with a multilayer structure.

Thus, light condensing efficiency may be improved to more reliably condense light incident from outside into one spot of the surface of the photo device. Furthermore, although angle of incidence increases, light condensing efficiency of the photo device may be significantly improved.

Furthermore, as the micro lens is formed, with a multi-layer structure, a complex pattern does not need to be implemented while the image sensor is designed. Thus, the fabrication process of the image sensor may be simplified. As a result, fabrication cost of the image sensor may be significantly reduced.

Furthermore, since the structure of the micro lens is not complex, the degree of freedom in design (or a design margin) may be improved. Thus, since existing processes may be used to fabricate the image sensor according to an embodiment, additional costs are not incurred in the fabrication of the image sensor according to an embodiment.

What is claimed is:

1. An image sensor comprising:
    a color filter suitable to pass a specific color of light;
    a micro lens formed under the color filter and including a plurality of layers, wherein the plurality of layers includes an upper layer and a lower layer, wherein the lower layer has a larger area than the upper layer; and
    a photo device formed under the micro lens and suitable to receive light passing through the micro lens and convert the received light into an electrical signal,
    wherein the lower layer has a larger thickness than the upper layer in a first direction which is perpendicular to the lower layer in order to reduce a reflection factor of a surface of the photo device and concentrate the light on one spot of the surface of the photo device.

2. The image sensor according to claim 1, wherein the micro lens includes silicon nitride (SiN), silicon oxide, or a combination thereof.

3. The image sensor according to claim 1, further comprising:
    an oxide layer provided between the micro lens and an adjacent micro lens and isolating the micro lenses from each other.

4. The image sensor according to claim 1, wherein the micro lens comprises:
    a first layer as the upper layer;
    a second layer as an intermediate layer, wherein the second layer is formed under the first layer and has a larger area than the first layer; and
    a third layer as the lower layer, wherein the third layer is formed under the second layer and has a larger area than the second layer.

5. The image sensor according to claim 4, wherein the second layer has a larger thickness than the first layer, and wherein the third layer has a larger thickness than the second layer.

6. The image sensor according to claim 1, wherein the upper layer is positioned substantially over a center of the lower layer.

7. The image sensor according to claim 1, further comprising:
    an anti-reflection film formed between the micro lens and the photo device and suitable to guide light emitted from the micro lens into the photo device.

8. The image sensor according to claim 1, wherein each of the upper and the lower layers is formed in a rectangular shape.

9. An image sensor including:
    a micro lens formed over a photo device,
    wherein the micro lens is suitable to condense the incident light and transmit the condensed light to the photo device,
    wherein the micro lens comprises:
    a circular first layer;
    a circular second layer formed under the first layer and having a larger area than the first layer; and
    a rectangular third layer formed under the second layer and having a larger area than the circular second layer,
    wherein the circular second layer has a larger thickness than the circular first layer, and
    wherein the rectangular third layer has a larger thickness than the circular second layer in a first direction which is perpendicular to the rectangular third layer in order to reduce a reflection factor of a surface of the photo device and concentrate the light on one spot of the surface of the photo device.

10. The image sensor according to claim 9,
    wherein the first layer is positioned substantially over a center of the second layer, and
    wherein the second layer is positioned substantially over a center of the third layer.

11. An image sensor comprising:
    a color filter that receives light;
    a micro lens formed under the color filter and condensing the light; and
    a photo device that converts the light into an electrical signal,
    wherein the micro lens includes a multi-layered structure,
    wherein the multi-layered structure includes a lower layer and an upper layer,
    wherein the upper layer is formed over the lower layer,
    wherein the lower layer and the upper layer are different from each other in size so that the micro lens is configured in a multi-step structure, and
    wherein the lower layer has a larger thickness than the upper layer in a first direction which is perpendicular to the lower layer in order to reduce a reflection factor of a surface of the photo device and concentrate the light on one spot of the surface of the photo device.

12. The image sensor of claim 11,
    wherein the light enters through the top of the multi-step structure and exits through the bottom of the multi-step structure.

13. An image sensor comprising:
    a photo device converting light into an electrical signal;
    a micro lens formed over the photo device and including a plurality of layers, wherein the plurality of layers includes a lower layer and an upper layer, wherein the lower layer has a larger area than the upper layer, wherein the lower layer has a larger thickness than the upper layer in a first direction which is perpendicular to the lower layer in order to reduce a reflection factor of a surface of the photo device and concentrate the light on one spot of the surface of the photo device;

an oxide layer provided between the micro lens and an adjacent micro lens and isolating the micro lenses from each other; and a color filter formed over the oxide layer and the micro lens and suitable to pass a specific color of light, wherein the color filter and the lower layer of the plurality of layers of the micro lens have a same width as each other.

* * * * *